United States Patent [19]
Harris

[11] Patent Number: 5,548,090
[45] Date of Patent: Aug. 20, 1996

[54] HEAT SINK AND PRINTED CIRCUIT BOARD COMBINATION

[75] Inventor: Mark R. Harris, Woodlawn, Canada

[73] Assignee: Northern Telecom Limited, Montreal, Canada

[21] Appl. No.: 517,327

[22] Filed: Aug. 21, 1995

[51] Int. Cl.$^6$ ........................................ H05K 1/00
[52] U.S. Cl. .................................. 174/252; 174/250
[58] Field of Search ................................ 174/252, 250

[56] References Cited

U.S. PATENT DOCUMENTS

| | | | |
|---|---|---|---|
| 4,707,726 | 11/1987 | Tinder | 174/252 |
| 4,887,147 | 12/1989 | Friedman | 174/252 |
| 4,888,637 | 12/1989 | Sway Tin et al. | 174/252 |
| 5,050,040 | 9/1991 | Gondsky et al. | 174/252 X |
| 5,155,661 | 10/1992 | Nagesh et al. | 361/386 |
| 5,306,866 | 4/1994 | Gruber et al. | 174/15.1 |
| 5,315,480 | 5/1994 | Samarov et al. | 174/252 X |
| 5,390,078 | 2/1995 | Taylor | 174/252 X |

*Primary Examiner*—Laura Thomas
*Attorney, Agent, or Firm*—R. J. Austin

[57] ABSTRACT

A heat conductor has a plurality of resilient elongate elements, each being connected to a surrounding base of the conductor through two neck portions and being pivoted about its common axis. Two end portions of each elongate element are curved. When the heat conductor is mounted on a heat sink which is held over a plurality of electronic components mounted upon a printed circuit board, the curved end portions contact both the components and the heat sink with an appropriate pressure, because of the torsional action of the neck portions. The elongate elements provide short thermal paths to directly conduct the heat generated by the components to the heat sink.

6 Claims, 2 Drawing Sheets

HEAT SINK AND PRINTED CIRCUIT BOARD COMBINATION

TECHNICAL FIELD

The present invention relates to a heat sink and printed circuit board combination.

BACKGROUND ART

In present electronic apparatus, electronic components (e.g., integrated circuits) are mounted upon printed circuit boards at a high density. Heat generated by such components are known to create overheating problems which could result in breakdown of one or more of the components. To solve such problems, it is necessary to remove heat from the components. In a conventional manner of achieving this, heat sinks are used which conduct heat directly or indirectly from the components.

In a paper by W. R. Hamburgen entitled "Interleaved Fin Thermal Connectors for Multichip Modules", published as part of the proceedings of the IEPS 1991 Conference, p. 419, at 428 and 429 show various types of heat removing arrangements.

A pending U.S. patent application Ser. No. 08/378,336 "Printed Circuit Board and Heat Sink Arrangement" filed by R. Katchmar on 26 Jan. 1995 discloses a structure in which a thermally conductive adhesive is sandwiched by an electronic component and a heat sink. Heat generated by the electronic component is transferred directly through the thermally conductive adhesive into the heat sink.

In a conventionally used structure, resilient heat conductor elements extend between electronic components and a heat sink to conduct heat from multiple components. A compliant thermal conductor is required due to tolerances and differential thermal expansion. The rate of heat transfer, and the pressure applied by each heat conductor element is proportional to the thickness and length of each heat conductor element. However, the maximum resilient strength of each heat conductor element is limited by the solder joint reliability of each electronic component and this, in turn, places a limit to the maximum rate of heat transfer through each heat conductor element.

SUMMARY OF THE INVENTION

It is an object of the present invention to provide a heat sink and printed circuit board combination which will avoid or minimize the above problems.

According to one aspect of the present invention, there is provided a heat sink and printed circuit board combination comprising: a printed circuit board having at least one electronic component extending from one side surface thereof; a heat sink mounted to face the one side surface of the board and spaced from the electronic component; and a compliant heat conductor for conducting heat into the heat sink, the heat conductor disposed between the component on the board and the heat sink and including a sheet metal base and a resilient heat conductor element integrally connected to the base by two resilient neck portions disposed one at each end of the conductor element with the element pivoted relative to the base about an axis extending through the neck portions. The heat conductor element extends between the heat sink and the electronic component and has two edge portions disposed one laterally on each side of the pivotal axis with one edge portion in contact with the heat sink and the other edge portion in contact with the electronic component, the edge portions being maintained in contact with the heat sink and the electronic component by resilient torsional action of the two neck portions about the pivotal axis.

With the resilient torsional action of the neck portions of the resilient heat conductor element, the contact of the edge portions of the heat conductor element with the electronic component and the heat sink is maintained with a proper pressure to prevent solder joint damage. The heat generated by the component is conducted to the heat sink through the heat conductor element.

In one example combination, a plurality of electronic components extend from the one side surface of the printed circuit board. An individual heat transfer means is provided for each electronic component. In this combination, each heat conductor means conducts the heat generated by each component.

In another example combination, a plurality of electronic components extend from the one side surface of the printed circuit board, and the heat conductor includes a single common sheet metal base held between the heat sink and the printed circuit board. The sheet metal base has a plurality of groups of resilient heat conductor elements, each group of the heat conductor elements extending between an individual electronic component and the heat sink. In this combination, each group of the heat conductor elements conduct the heat generated by each component.

With structures according to the present invention, the resiliency in the neck portions controls the loading which is applied to the electronic components by way of the conductor elements. Thus, the length and thickness of each conductor element is insignificant in this respect and these dimensions may be chosen to produce the required rate of heat transfer from the conductor elements which is required.

BRIEF DESCRIPTION OF THE DRAWINGS

Embodiments of the invention will now be described by way of example with reference to the accompanying drawings, in which.

DETAILED DESCRIPTION

A prior construction, with reference to FIGS. 1 and 2, will be described in order to detail attendant problems with this structure. Embodiments of the invention will then be described together with attendant advantages of the structures of the embodiments which avoid or minimize these problems.

Figure 1:
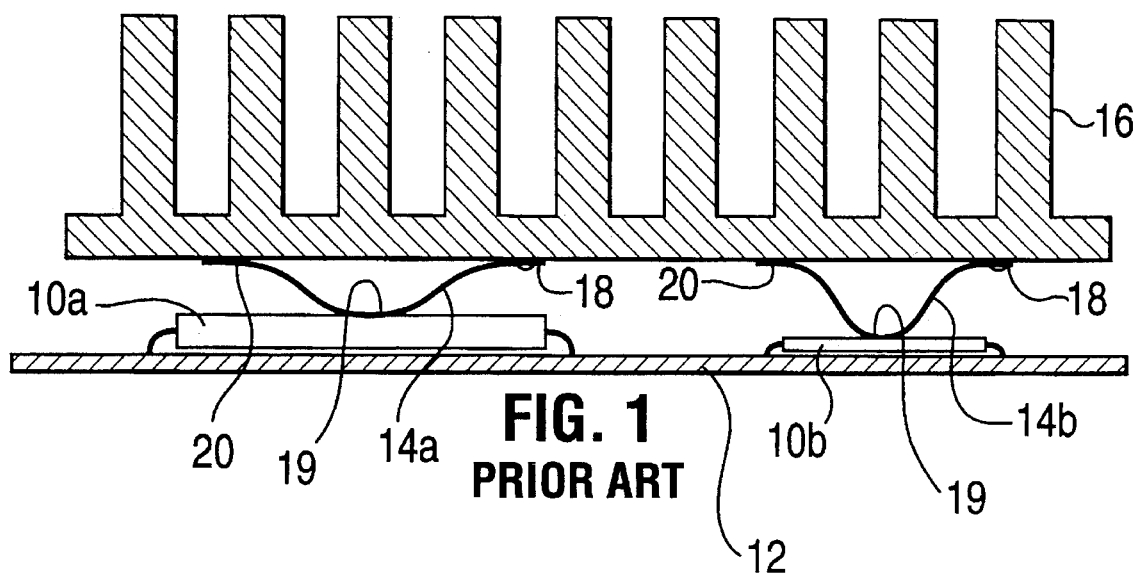
FIG. 1 a cross-sectional view through a prior art heat sink and printed circuit board combination.
Figure 2:
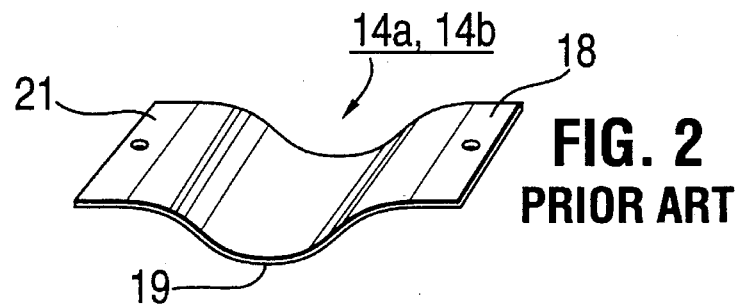
FIG. 2 is an isometric view of a heat conductor of the combination shown in FIG. 1.

One prior art combination to directly conduct heat from electronic components is shown in FIG. 1. A plurality of electronic components 10a, 10b are mounted upon a printed circuit board 12. Respective resilient curved heat conductors 14a, 14b for the electronic components 10a, 10b are mounted upon a heat sink 16. One end 18 (FIG. 2) of each heat conductor 14a, 14b is fixed to the heat sink 16 and its curved mid-portion 19 contacts and is resiliently held against the surface of the electronic component 10. The other end 20 of each heat conductor is free. During operation of the circuitry, the electronic components 10a, 10b generate heat which is conducted to one side of the heat sink 16 via the heat conductors 14a, 14b. Because the heat sink 16 has fins on the other side, the heat from the electronic components 10a, 10b is distributed to air through a large area of the surface of the heat sink 16.

However, there are drawbacks in this combination. The rate of heat transfer is affected by the thickness and length of each heat conductor. Thus, it would be advantageous, for maximum heat transfer, to increase these and therefore place a high load upon a component. This would need to be accompanied by an increase in thickness and/or a decrease in spring length of the associated heat conductor which would also increase the rate of heat transfer from the component. Unfortunately, the load to be placed upon any individual component is limited by solder joint stress and hence the compression force of the heat conductor is also limited and this has a limiting effect upon the heat transfer. Unacceptable solder joint stress results from optimizing the thermal path of this spring configuration. Conversely, reducing the solder joint stress to acceptable levels also degrades the thermal performance.

The present invention differs from the above prior art combination as is clear from the following embodiments.

Figure 3:
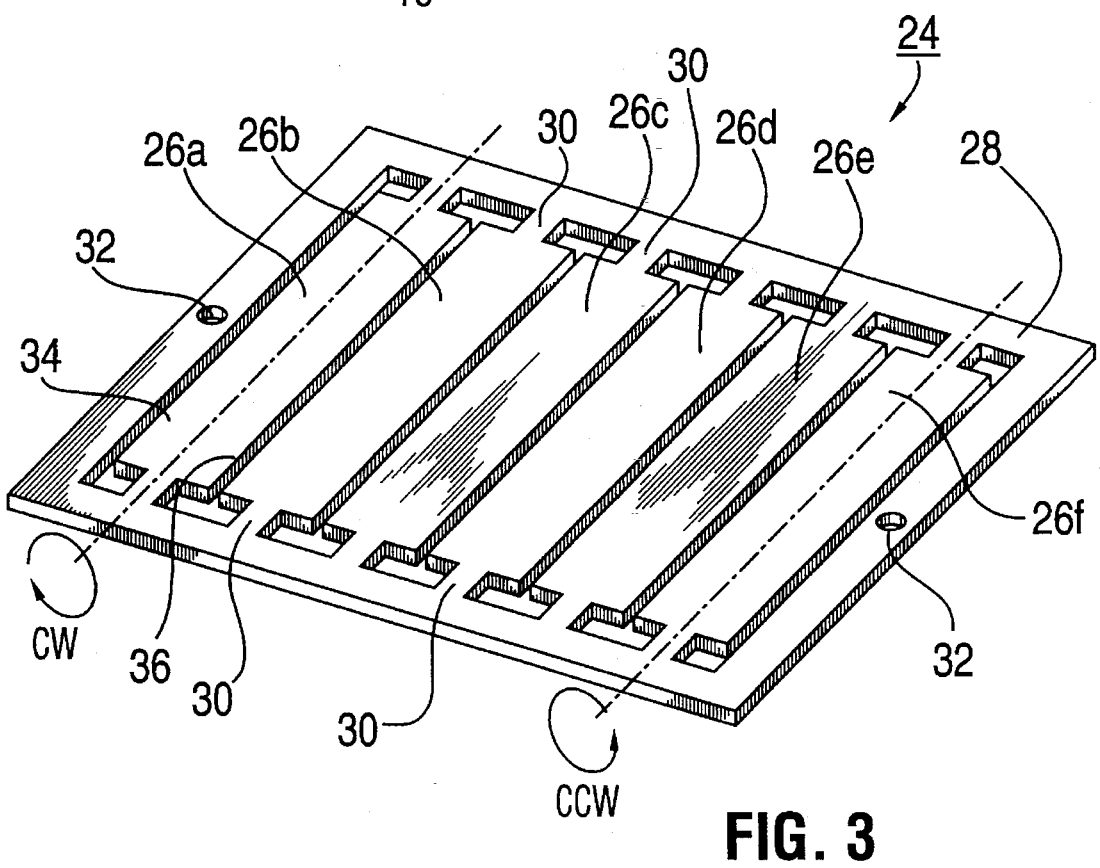
FIG. 3 is a perspective view of a heat conductor which is used in a first and other embodiments according to the present invention.
Figure 4:
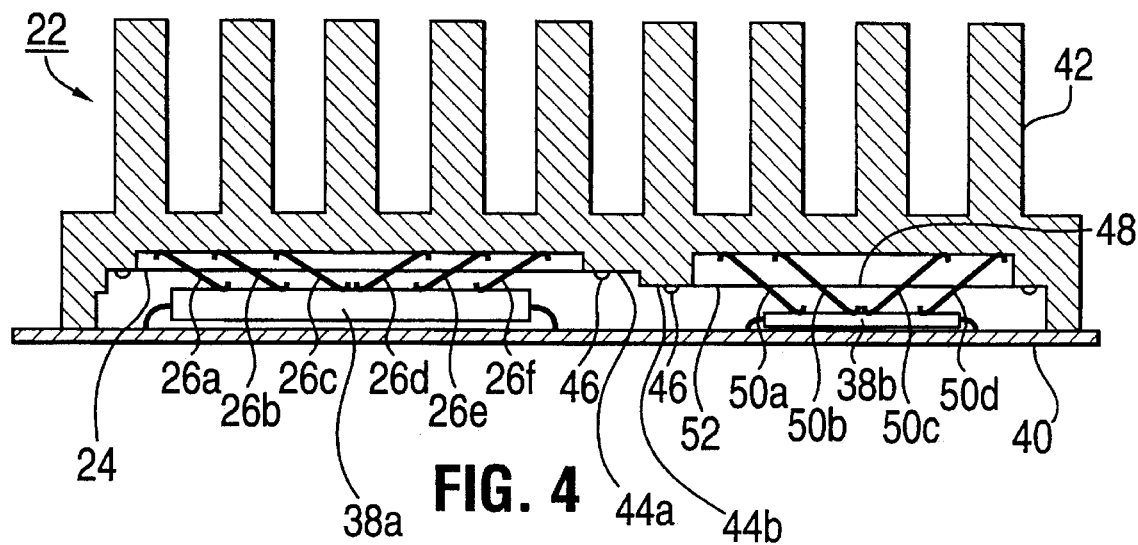
FIG. 4 is a cross-sectional view of a first embodiment according to the present invention.

In a first embodiment, in a heat sink and printed circuit board combination 22 shown in FIG. 4, a heat conductor 24 is used as shown in FIG. 3. The heat conductor 24 is formed from a rectangular sheet of beryllium copper, which is cut by etching such that six elongate heat conductor elements 26a–26f are formed therein. Each element 26a–26f is integrally connected to a surrounding base 28 of the heat conductor 24 by two neck portions 30 extending in alignment from opposite ends of the element. Also, two holes 32 are formed at both ends of the sheet in the base 28 by etching. The left three elements 26a–26c are pivoted in a clockwise direction about the common axis of the neck portion of each element. The right three elements 26d–26f are pivoted in a counter clockwise direction about these axes. This pivoting action is caused by end-to-end torsional twisting of the neck portions 30. Furthermore, left and right edge portions 34 and 36 of the elongate heat conductor elements 26a–26f are roundly bent so as to make them curved.

Referring to FIG. 4 in the combination 22, a plurality of electronic components 38a, 38b are mounted upon a printed circuit board 40 over which a common heat sink 42 is mounted. The heat sink 42 has at its one side a plurality of cavities in which the respective components 38a, 38b are contained. Around the cavities, planar surfaces 44a, 44b are formed. Because the sizes of the components 38a, 38b are not identical, the sizes of the cavities are different. The other side of the heat sink 42 is provided with fins to form a large effective area for convection of the conducted heat. The heat conductor 24 is located over a respective component 38a and secured by screws 46 through the holes 32 to the planar surface 44a.

In the embodiment, another heat conductor 48 is located between the electronic component 38b and the heat sink 42. The heat conductor 48 is similar in construction to the heat conductor 24, but instead of six heat conductor elements, the heat conductor 48 has four heat conductor elements 50a–50d integral with a surrounding base 52. Because of difference in the distances between the surfaces of the electronic components from the surface of the heat sink 42, the conductor elements 50a–50d are wider than elements 26a–26f. The left two elements 50a, 50b are pivoted in a counter clockwise direction and the right two elements 50c, 50d are pivoted in a clockwise direction.

When assembled, the curved edge portions 34 and 36 of each heat conductor element of the heat sink 24 contact the surface of the component 38a and the surface of the heat sink 42, respectively. The neck portions 30 are resiliently torsionally stressed to hold the curved edge portions 34 and 36 firmly in contact with the surface of the component 38a and the heat sink 42, respectively. Similarly, the neck portions of the heat conductor elements 50a–50d with the heat conductor 48 hold the curved end portions thereof in contact firmly with the surface of the component 38b and the heat sink 42.

During operation of the circuitry, the heat generated by the components 38a, 38b is conducted by the elements 26a–26f and the elements 50a–50d into the heat sink 42. The neck portions 34 and 36 of the heat conductor 24 and the corresponding neck portions of the heat conductor 48 are torsionally stressed to press the heat conductor elements against the electronic components 38a, 38b. The load applied by the elements 26a–26f and 50a–50d, is dependent upon the resilient strength of the neck portions which is, in turn, dependent upon the dimensions of the neck portions of the specific material in use. On the other hand, the heat conductive characteristics of the conductor elements 26a–26f and 50a–50d are dependent upon the dimensions of these elements. It follows therefore that different criteria are under consideration for determining loading to be applied to the components 38a, 38b from these for providing a desired heat conduction rate. The rate of heat removal from the components 38a 38b need not therefore be affected by any maximum loading which may be applied against either of the components 38a, 38b.

Figure 5:
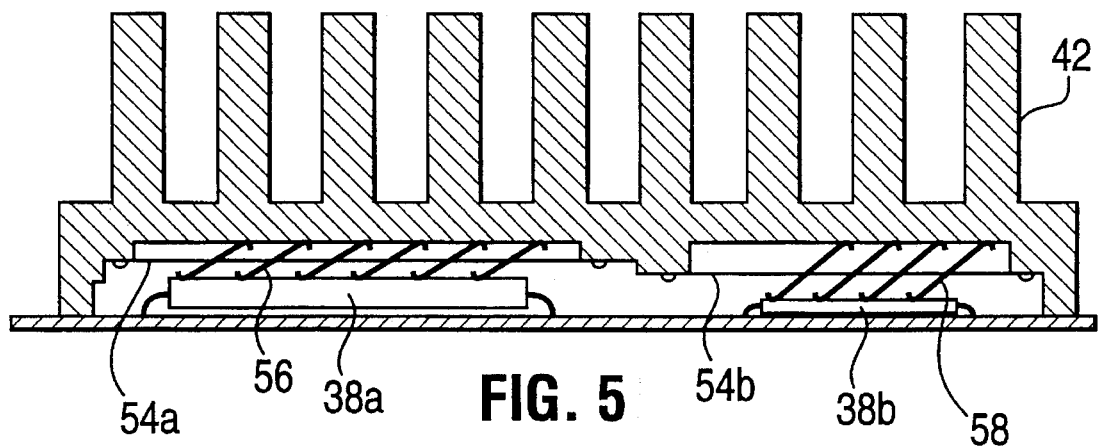
FIG. 5 is a cross-sectional view of a second embodiment according to the present invention.

In a second embodiment as shown in FIG. 5, a plurality of heat conductors 54a, 54b are held over the electronic components 38a, 38b and secured to the heat sink 42. The heat conductors 54a, 54b have a plurality of heat conductor elements 56 and 58, respectively. The elements of each heat conductor are pivoted in the same direction.

Figure 6:
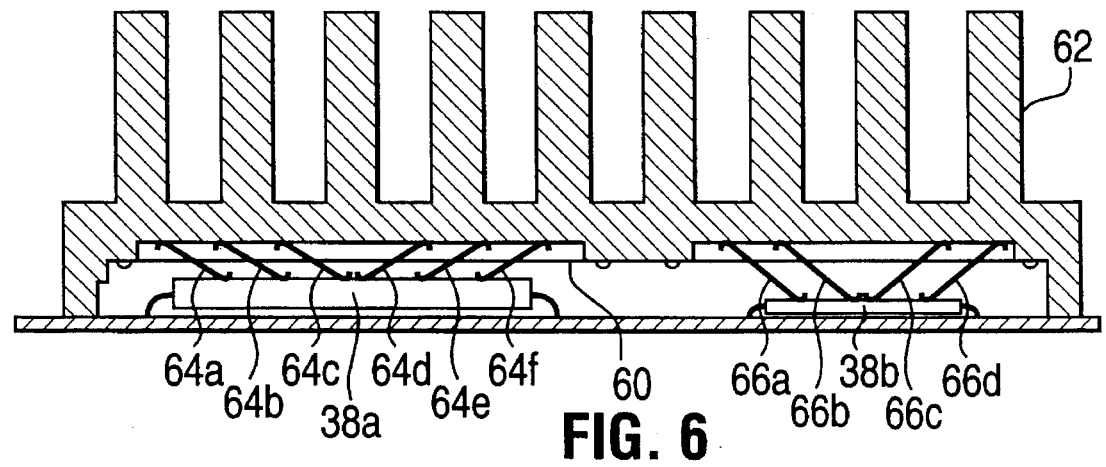
FIG. 6 is a cross-sectional view of a third embodiment according to the present invention.

In a third embodiment as shown in FIG. 6, a single heat conductor 60 is held over the electronic components 38a, 38b and secured to a heat sink 62. In the heat conductor 60, a plurality of groups of heat conductor elements are formed therein by etching a larger sheet of beryllium copper. A group of elements 64a–64f and another group of elements 66a–66d are provided in the heat conductor 60.

In modifications (not shown) of the third embodiment, a single heat conductor has three or more groups of heat conductor elements.

While a single heat sink is commonly used for a plurality of electronic components in the embodiments, an individual heat sink may be used for each of the electronic components.

What is claimed is:

1. A heat sink and printed circuit board combination comprising:

a printed circuit board having at least one electronic component extending from one side surface thereof;

a heat sink mounted to face the one side surface of the board and spaced from the electronic component; and a compliant heat conductor for conducting heat into the heat sink, the heat conductor disposed between the component on the board and the heat sink and including a sheet metal base and a resilient heat conductor element integrally connected to the base by two resilient neck portions disposed one at each end of the conductor element with the element pivoted relative to the base about an axis extending through the neck portions, the heat conductor element extending between the heat sink and the electronic component and having two edge portions disposed one laterally on each side of the pivotal axis with one edge portion in contact with the heat sink and the other edge portion in contact with the electronic component, the edge portions being maintained in contact with the heat sink and the electronic component by resilient torsional action of the two neck portions about the pivotal axis.

2. A heat sink and printed circuit board combination according to claim 1, wherein a plurality of electronic components extend from said one side surface of the printed circuit board and a plurality of heat conductors are provided, one individual heat conductor means for each electronic component.

3. A heat sink and printed circuit board combination according to claim 1, wherein a plurality of electronic components extend from said one side surface of the printed circuit board, and the heat conductor includes a single common sheet metal base held between the heat sink and the printed circuit board, the sheet metal base having a plurality of groups of resilient heat conductor elements, each group of the heat conductor elements extending between an individual electronic component and the heat sink.

4. A heat sink and printed circuit board combination according to claim 1, wherein each edge portion is curved, the curved portions having convex surfaces contacting the heat sink and the electronic component.

5. A heat sink and printed circuit board combination according to claim 1, including a plurality of heat conductor elements at least one of which is pivoted in one direction relative to its axis and at least another of which is pivoted in the opposite direction relative to its axis.

6. A heat sink and printed circuit board combination according to claim 1, including a plurality of heat conductor elements which are pivoted in the same direction around their axes.

* * * * *